United States Patent
Abramson et al.

(10) Patent No.: US 10,125,298 B2
(45) Date of Patent: Nov. 13, 2018

(54) HIGH THERMAL CONDUCTIVITY GRAPHITE AND GRAPHENE-CONTAINING COMPOSITES

(71) Applicant: CASE WESTERN RESERVE UNIVERSITY, Cleveland, OH (US)

(72) Inventors: Alexis Abramson, Cleveland Heights, OH (US); Ica Manas-Zloczower, Orange, OH (US); Nayandeep K. Mahanta, Cleveland Heights, OH (US); Marcio R. Loos, Blumenau/SC (BR)

(73) Assignee: CASE WESTERN RESERVE UNIVERSITY, Cleveland, OH (US)

(*) Notice: Subject to any disclaimer, the term of this patent is extended or adjusted under 35 U.S.C. 154(b) by 947 days.

(21) Appl. No.: 14/211,032

(22) Filed: Mar. 14, 2014

(65) Prior Publication Data

US 2016/0376487 A1    Dec. 29, 2016

Related U.S. Application Data

(60) Provisional application No. 61/782,344, filed on Mar. 14, 2013.

(51) Int. Cl.
| | |
|---|---|
| *B32B 9/00* | (2006.01) |
| *C09K 5/14* | (2006.01) |
| *C08K 3/04* | (2006.01) |
| *H01L 23/373* | (2006.01) |
| *B32B 27/38* | (2006.01) |

(52) U.S. Cl.
CPC ............... *C09K 5/14* (2013.01); *B32B 27/38* (2013.01); *C08K 3/04* (2013.01); *H01L 23/373* (2013.01); *H01L 23/3737* (2013.01); *C08K 2201/011* (2013.01); *C08K 2201/014* (2013.01); *Y10T 428/29* (2015.01); *Y10T 428/2927* (2015.01);
(Continued)

(58) Field of Classification Search
None
See application file for complete search history.

(56) References Cited

U.S. PATENT DOCUMENTS

| | | | |
|---|---|---|---|
| 8,530,566 B2 * | 9/2013 | Lin | C08K 3/04 |
| | | | 524/495 |
| 2005/0045855 A1 * | 3/2005 | Tonapi | C09K 5/14 |
| | | | 252/500 |

(Continued)

FOREIGN PATENT DOCUMENTS

| | | |
|---|---|---|
| CN | 102102001 A | 6/2011 |
| CN | 102127324 A | 7/2011 |

(Continued)

OTHER PUBLICATIONS

Angstron Materials, "N002-PDR Technical Data Sheet", Apr. 2014.*
(Continued)

*Primary Examiner* — Seth Dumbris
(74) *Attorney, Agent, or Firm* — Hudak, Shunk & Farine Co., LPA

(57) ABSTRACT

Micro-nano hybrid composites exhibiting desirable thermal conductivity levels due to the presence of specific ratios of graphite to graphene that have been found to reduce the overall thermal interface resistance. The composites are preferably epoxy matrix composites in some embodiments. Devices including the composites and methods of preparing the composites are also disclosed.

18 Claims, 3 Drawing Sheets

(52) U.S. Cl.
CPC ........ *Y10T 428/2982* (2015.01); *Y10T 428/30* (2015.01)

(56) References Cited

U.S. PATENT DOCUMENTS

| | | | |
|---|---|---|---|
| 2010/0000441 A1 | 1/2010 | Jang et al. | |
| 2010/0055025 A1* | 3/2010 | Jang .................. | B82Y 30/00 |
| | | | 423/448 |
| 2010/0140792 A1* | 6/2010 | Haddon .............. | B82Y 30/00 |
| | | | 257/713 |
| 2012/0142832 A1* | 6/2012 | Varma ................ | C09D 5/24 |
| | | | 524/145 |
| 2012/0229981 A1 | 9/2012 | Lin et al. | |
| 2012/0277360 A1* | 11/2012 | Scheffer ............ | C09D 177/00 |
| | | | 524/237 |
| 2012/0296012 A1 | 11/2012 | Palmese et al. | |
| 2012/0302668 A1 | 11/2012 | Choi et al. | |
| 2013/0260150 A1* | 10/2013 | Grivei ................. | C01B 31/04 |
| | | | 428/402 |

FOREIGN PATENT DOCUMENTS

| | | |
|---|---|---|
| CN | 102153835 A | 8/2011 |
| CN | 102443247 A | 5/2012 |

OTHER PUBLICATIONS

Mahanta, N.K., "Thermal Transport in Isolated Carbon Nanostructures and Associated Nanocomposites", Aug. 2012, Case Western Reserve University.*

Asbury Carbons, "Surface Enhanced Flake Graphite", Aug. 2016, Asbury Graphite Mills, Inc.*

* cited by examiner

HIGH THERMAL CONDUCTIVITY GRAPHITE AND GRAPHENE-CONTAINING COMPOSITES

FIELD OF THE INVENTION

The present invention relates to micro-nano hybrid composites exhibiting desirable thermal conductivity levels due to the presence of specific ratios of graphite to graphene that have been found to reduce the overall thermal interface resistance. The composites are preferably epoxy matrix composites in some embodiments. Devices including the composites and methods of preparing the composites are also disclosed.

BACKGROUND OF THE INVENTION

Thermally conductive composites have become interesting candidate materials for numerous applications, particularly for thermal management of electronics. Modern microelectronic chips owing to their extremely high power densities require very high conductivities from materials used as gap fillers, heat spreaders, thermal pads and pastes, and thermal interface materials (TIMs), which are vital components of the entire thermal management package and are critical to ensuring good thermal contact between the chips and the metal heat sinks. The aforementioned materials are typically polymers filled with metal (aluminum and silver) or ceramic (boron nitride, aluminum nitride, silicon carbide, etc.) particles to boost their thermal conductivities. Such conventional materials are, however, reaching the limits of performance and the thermal management engineers are seeking higher thermal conductivity polymeric materials.

Another desirable characteristic of polymeric materials used in the thermal management of electronics, particularly consumer electronic devices such as laptops, cellphones, etc, is their light weight. Metal or ceramic fillers are typically high density materials and add undesirable weight to the composites. Consequently, it is worth considering graphite, which owing to its relatively low density (2100 kg/m3) and very high thermal conductivity (up to ~2000 W/m-K), serves as an excellent alternative to conventional metal and ceramic fillers. The nanoscale manifestations of graphite are well known for their extremely high thermal conductivities and have great potential to be used as fillers in materials for thermal management applications. However, a glance at the literature tells a different story, and after years of extensive research it can now be concluded that the nanofillers, when used alone, owing to their size, lead to numerous interfaces in the composites and therefore a large aggregate thermal interface resistance in the composites. As a result, the thermal conductivities of polymeric nanocomposites have remained quite low, or about 10 W/m-K in some embodiments.

Various researchers have investigated graphite, graphene and other compounds exhibiting sought after properties such as electrical insulation or conduction and thermal conduction, for example:

U.S. Patent Application Publication 2012/0302668 relates to a semiconductor sealing material composition, including: 9.0-13 wt % of an epoxy resin; 6-7 wt % of a hardener; 0.2-0.3 wt % of a curing catalyst; 0.60-0.68 wt % of at least one additive selected from the group consisting of a coupling agent, a release agent and a coloring agent; and 79-84 wt % of a filler, wherein the filler is nano-graphene plate powder. The semiconductor sealing material composition reportedly has excellent crack resistance at a high temperature of 270° C. or more and has high thermal conductivity and excellent flame retardancy.

U.S. Patent Application Publication 2012/0296012 relates to formulations containing a mixture of an epoxy resin and an ionic liquid or an adduct of an epoxy resin and an ionic liquid which may initiate curing of the epoxy resin, the mixture having nano-materials dispersed or dissolved therein. These formulations reportedly can be used for the preparation of nanocomposites. Methods of preparing nanocomposites by curing a dispersion of nano-materials in a mixture of an epoxy resin and an ionic liquid or an adduct of an epoxy resin and an ionic liquid which may initiate curing of the epoxy resin are disclosed. The nanocomposites comprise a cured product formed by curing an epoxy resin with an ionic liquid or an adduct of an epoxy resin and an ionic liquid having nano-materials dispersed or dissolved therein. Embodiments reportedly permit manufacture of nanocomposites having relatively high fracture toughness, relatively high loadings of nano-materials and the ability to tailor the properties of the nano-composites.

U.S. Patent Application Publication 2012/0229981 relates to an electrically insulating and thermally conductive composition including 5-80 parts by weight of a resin, 20-95 parts by weight of an electrically insulating and thermally conductive powder, and 0.0001-2 parts by weight of a graphene. Another embodiment provides an electronic device including the electrically insulating and thermally conductive composition.

U.S. Patent Application Publication 2012/0142832 relates to compositions comprising at least one polymer binder, graphene sheets, and graphite, wherein the ratio by weight of graphite to graphene sheets is from about 40:60 to about 98:2.

U.S. Patent Application Publication 2010/0140792 relates to a procedure for bulk scale preparation of high aspect ratio, 2-dimensional nano platelets comprised of a few graphene layers. Use of these nano platelets in applications such as thermal interface materials, advanced composites, and thin film coatings reportedly provide material systems with superior mechanical, electrical, optical, thermal, and antifriction characteristics.

U.S. Patent Application Publication 2010/0000441 relates to a nano graphene platelet-based conductive ink comprising: (a) nano graphene platelets (preferably un-oxidized or pristine graphene), and (b) a liquid medium in which the nano graphene platelets are dispersed, wherein the nano graphene platelets occupy a proportion of at least 0.001% by volume based on the total ink volume. The ink can also contain a binder or matrix material and/or a surfactant. The ink may further comprise other fillers, such as carbon nanotubes, carbon nano-fibers, metal nano particles, carbon black, conductive organic species, etc. The graphene platelets preferably have an average thickness no greater than 10 nm and more preferably no greater than 1 nm. These inks can be printed to reportedly form a range of electrically or thermally conductive components.

Chinese Publication CN102102001 relates to a high thermal conductivity graphene-based epoxy resin adhesive and a preparation method thereof. The epoxy resin adhesive comprises the following raw materials by weight percent: 40%-60% of graphene-based epoxy resin, 2%-10% of reaction diluent, 3%-7% of curing agent, 1%-3% of promoting agent, 0.5%-1.5% of coupling agent and high performance thermal conductive filler. The high thermal conductivity graphene-based epoxy resin adhesive is based on the high thermal conductivity of graphene; under the preset technological conditions, graphene is reportedly evenly dispersed in epoxy resin matrix; by increasing the high thermal conductivity of the resin matrix and adding a small amount of high performance thermal conductive filler, the prepared adhesive reportedly has high thermal conductivity and low density and is especially suitable for the thermal conductive packaging of high-end fine electrical and electronic components.

Chinese Publication CN102127324 relates to a preparation method of a modified graphene oxide, comprising the following steps of: (a) reacting a phosphorus oxychloride compound, cyanuric chloride or diisocyanate with glycidol to obtain an intermediate product; and (b) dispersing graphite oxide in an organic solvent, dropwise adding to the intermediate product obtained through reaction, and reacting to obtain the modified graphene oxide. The publication also provides a preparation method of a composite material containing the modified graphene oxide, comprising the following steps of: dispersing the modified graphene oxide obtained through the preparation method in the technical scheme in an organic solvent, mixing the modified graphene oxide containing epoxide groups with epoxy resin oligomers and a polyamide curing agent, and curing to obtain the composite material containing the modified graphene oxide. In the composite material provided, the modified graphene oxide reportedly reacts with a resin substrate, is more uniform to disperse in the obtained composite material, and has better flame-retarding performance.

Chinese Publication CN102153835 relates to a modified graphene/epoxy resin composite material and a preparation method thereof. The modified graphene/epoxy resin composite material has a two-phase structure, wherein an epoxy resin substrate serves as a main body, and black modified graphene serves as a wild phase. A preparation process comprises the following steps of: preparing graphite oxide; preparing graphene oxide; and preparing a modified graphene/epoxy resin composite material. The modified graphene/epoxy resin composite material reportedly has higher toughness compared with epoxy resin and a graphene/epoxy resin composite material, the interface bonding performance between graphene and epoxy resin is greatly enhanced, and the utilization of the performance of graphene is facilitated. By adopting the preparation method of the modified graphene/epoxy resin composite material, the reaction temperature for the preparation of graphite oxide serving as an intermediate product is raised, thus the reaction speed is increased.

Chinese Publication CN102443247 relates to a preparation method of graphene oxide grafted POSS (polyhedral oligomeric silsesquioxane) modified epoxy resin. The preparation method comprises the following steps of: taking crystalline flake graphite as a raw material, preparing graphite oxide through adopting a Hummers oxidation method, further adding the graphite oxide into distilled water, forming a uniformly-dispersed graphene oxide mixed solution under an ultrasonic environment, further adding POSS and a strong catalyst, performing full reaction, then filtering, washing and drying to get black powder; and further uniformly dispersing graphene oxide/POSS in an epoxy resin matrix, cross-linking and bonding under the action of a curing agent to get a composite material, molding by casting, cooling and demolding. According to the preparation method disclosed by the invention, the POSS is successfully grafted on a graphene oxide sheet layer, and advantages of the graphene oxide structure and the POSS structure are reportedly complemented, so that the preparation method has the advantages of low cost and easy obtaining of the raw material, easy operation, simple process, good reproducibility and obvious toughening modification effect against the epoxy resin.

However, the art still needs high thermally conductive composites that are relatively low density and include a thermally conductive filler mixture that exhibit relatively low thermal resistance at filler interfaces.

SUMMARY OF THE INVENTION

In view of the above, it would be desirable to provide a composite material that is relatively highly thermally conductive, while including thermally conductive fillers that have a relatively low density.

Yet a further object is to provide a thermally conductive composite comprising a base matrix or resin and thermally conductive fillers comprising a defined ratio of graphite to graphene.

Still another object of the present invention is to provide an epoxy-based thermally conductive composite comprising a synergistic amount of graphite and graphene whereby the relatively large, micro-particle or flake size and planar structure of graphite ensures a minimization in the number of interfaces per unit length thereby leading to a relatively high thermal conductivity, while the addition of a smaller amount of nano-size graphene further enhances thermal conductivity.

A further object of the present invention is to provide a composite including graphene nanoplatelets located within a matrix material that provides desirable thermal contact with relatively larger micro-size graphite flakes to provide the composite with relatively low resistance and desirable thermal conductivity.

Still an additional object of the present invention is to provide a device, preferably an electronic device having an electrically insulating and thermally conductive element.

A further object is to provide the device, in particular an electronic device with a heat producing element, a heat dissipating element, and an electrically insulating and thermally conductive composite comprising a matrix, for example epoxy, and a defined ratio of graphite and graphene.

BRIEF DESCRIPTION OF THE DRAWINGS

The invention will be better understood and other features and advantages will become apparent by reading the detailed description of the invention, taken together with the drawings, wherein.

DETAILED DESCRIPTION OF THE INVENTION

Figure 1:
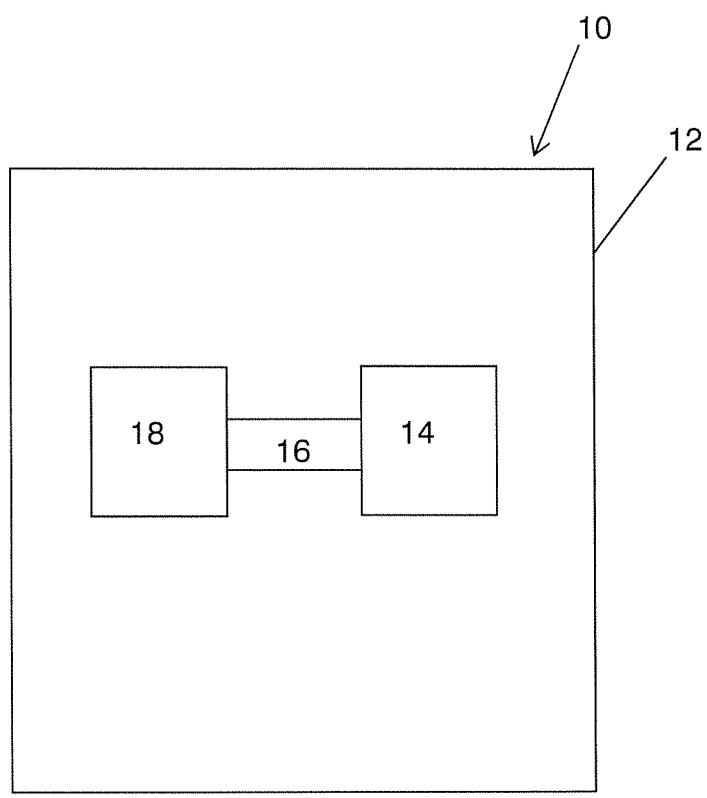
FIG. 1 a top view of one embodiment of a device of the present invention including a composite according to the present invention connecting a heat producing component with a heat dissipating component.

High thermal conductivity composite compositions are disclosed; in particular micro-nano hybrid composites comprised of both graphite and graphene fillers in a polymer matrix, with an epoxy matrix being preferred.

An unexpected synergistic relationship has been discovered between the graphite, graphene and polymer system utilizing a specified ratio of graphite to graphene. It was discovered that the similar atomic structures of graphite and graphene provide relatively low thermal resistance at their interfaces. Moreover, the relatively large flake size and planar structure of graphite particles ensures a minimization in the number of interfaces per unit length, thereby leading to a relatively high thermal conductivity. It has been found that the addition of a relatively small amount of graphene further enhances thermal conductivity. Additionally it has been found that the presence of oxygen in oxygen intercalated graphene is likely to provide better chemical interaction with an epoxy matrix which is also beneficial for thermal conductivity of the composite composition.

Graphite

As indicated herein, the compositions of the present invention include graphite. Graphite is utilized because it has a relatively low density of about 2100 kg/m$^3$ and a relatively high thermal conductivity, for example in some embodiments up to about 2000 W/m-K. Suitable sources of graphite include natural graphite, synthetic graphite, annealed graphite, oriented graphite, Kish graphite, and pyrolytic graphite. In a preferred embodiment, the graphite is exfoliated graphite. Preferred graphites generally have a large flake size and substantially planar structure.

Utilizing relatively large, generally micro-meter size flakes of graphite allows for a smaller number of interfaces per length of the composite composition. Graphite particles or flakes that are too large are typically avoided to enable ease of processing, whereas, too small flakes are avoided to ensure low interface thermal resistance. That said, the particle size of the graphite generally ranges from about 5 to about 500 microns in width, 5 to about 500 microns in length, and 5 to about 500 nanometers in height or thickness. In one preferred embodiment, the graphite flake or particle size is about 40 microns wide by about 40 microns long and has a height or thickness of several hundred nanometers.

In a further embodiment preferred graphite flakes or particles are surfaced enhanced. Surface enhancement can influence interfacial characteristics, thereby leading to further enhancement in properties.

Suitable graphite is commercially available from sources such as Asbury Carbons, Asbury, N.J. as Asbury Carbons 3807 surface enhanced flake graphite.

Graphene

The composite compositions of the present invention also include graphene.

The most commonly used routes for synthesizing graphene, a monolayer of graphite, include exfoliation and cleavage of graphite, thermal chemical vapor deposition and plasma enhanced chemical vapor deposition techniques. Graphene synthesis by exfoliation and cleavage follows the idea of breaking the weak Van der Waals interactions between adjacent sheets or graphite. The specific method utilized for separation the individual sheets can vary widely in terms of the chemicals used to achieve the overarching goal. One such method involves repeated peeling of highly oriented pyrolytic graphite (HOPG), which was most notably used by Novoselov et al. in their ground-breaking experiments for which they were awarded the Nobel Prize in physics in 2010. The HOPG sheet was first subjected to dry etching in oxygen plasma to make 5 μm deep mesas. The etched sheet was then put on a photoresist and baked, followed by the use of scotch tape to peel of the graphene layers. This method, along with its slight modifications, has since been popularly known as the "scotch-tape" method and holds the promise for yielding relatively large, high quality, single or bilayer graphene sheets.

A somewhat more commercial method, still following on the idea of exfoliation and cleavage of graphite, involves oxidative treatment of graphite with chemicals such as sulfuric acid to form graphite oxide or oxygen-intercalated graphite. The resulting intercalated graphite is exfoliated by techniques such as ultrasonication and rapid heating to high temperatures to rupture the chemical bonds between adjacent sheets. Finally, the exfoliated graphite sheets are reduced using chemicals such as hydrazine hydrate. This method offers a significantly high throughput and has thus been adopted for industrial synthesis of graphene. However, the major drawback of this method is the low yield of single-layer graphene and incomplete reduction of the graphene oxide sheets, leading to a high concentration of defects.

The graphene sheets utilized in the present invention in various embodiments are layered planar structures having substantially hexaganol or rhombohedral lattices. Hexaganol patterned graphing sheets are one atom thick layers, while some graphene plates in general can have a thickness of a few sheets.

In some preferred embodiments, the graphene is oxygen intercalated few layer graphene sheets which has been found to enhance thermal conductivity of the composite compositions and also provide better interaction with an epoxy matrix. In addition, owing to its planar form, graphene holds the promise of providing reduced interface resistances when used to fill a polymer matrices. Compared to carbon nanotubes, the reduced interfaced resistance is most likely due to the larger contact area with another graphene platelet or with the matrix.

The thermal transport phenomenon in graphene is known to vary from being 2-dimensional to 3-dimensional with addition of subsequent layers and is eventually expected to approach the value for bulk graphite. This reduction in thermal conductivity with the increasing number of graphene layers has been previously shown both experimentally, and from molecular and lattice dynamics calculations. In addition, thermal conductivity of bulk graphite is known to be influenced by the spacing between the adjacent layers or the interlayer spacing.

Various types of graphene sheets or nanoplatelets can be utilized in the present invention which have different nanometer scale thicknesses and aspect ratios. The graphene can also have different lateral dimensions as well as oxygen and carbon contents. In various embodiments the carbon content is generally greater than 70 wt. %, desirably greater than 80 wt. %, and preferably greater than 90 wt. % of the graphene. Examples of different graphene that can be utilized in the present invention have properties as set forth in Tables 1 and 2.

TABLE 1

Dimensions and Chemical Compositions of Graphene Nanoplatelets

| Sample | Thickness (nm) | Lateral Dimensions (μm) | Carbon Content (%) | Oxygen Content (%) |
|---|---|---|---|---|
| 1 | ~1* | ~5 | ~93 | <7 |
| 2 | ~10-15 | ~15-20 | ~99 | <2 |
| 3 | ~10-15 | ~15-20 | ~99 | <2 |

TABLE 2

Interlayer Spacing, number of layers and Thermal Conductivities of the Graphene Nanoplatelets

| Sample | Interlayer Spacing, $d_{002}$ (nm) | Number of Layers | Thermal conductivity (W/m-K) |
|---|---|---|---|
| 1 | 0.3540 | ~3 | 776 ± 96 |
| 2 | 0.3376 | ~30-45 | 2130 ± 314 |
| 3 | 0.3372 | ~30-45 | 2275 ± 338 |

All of the graphene samples were obtained from Angtron Materials, Dayton, Ohio.

Figure 2:
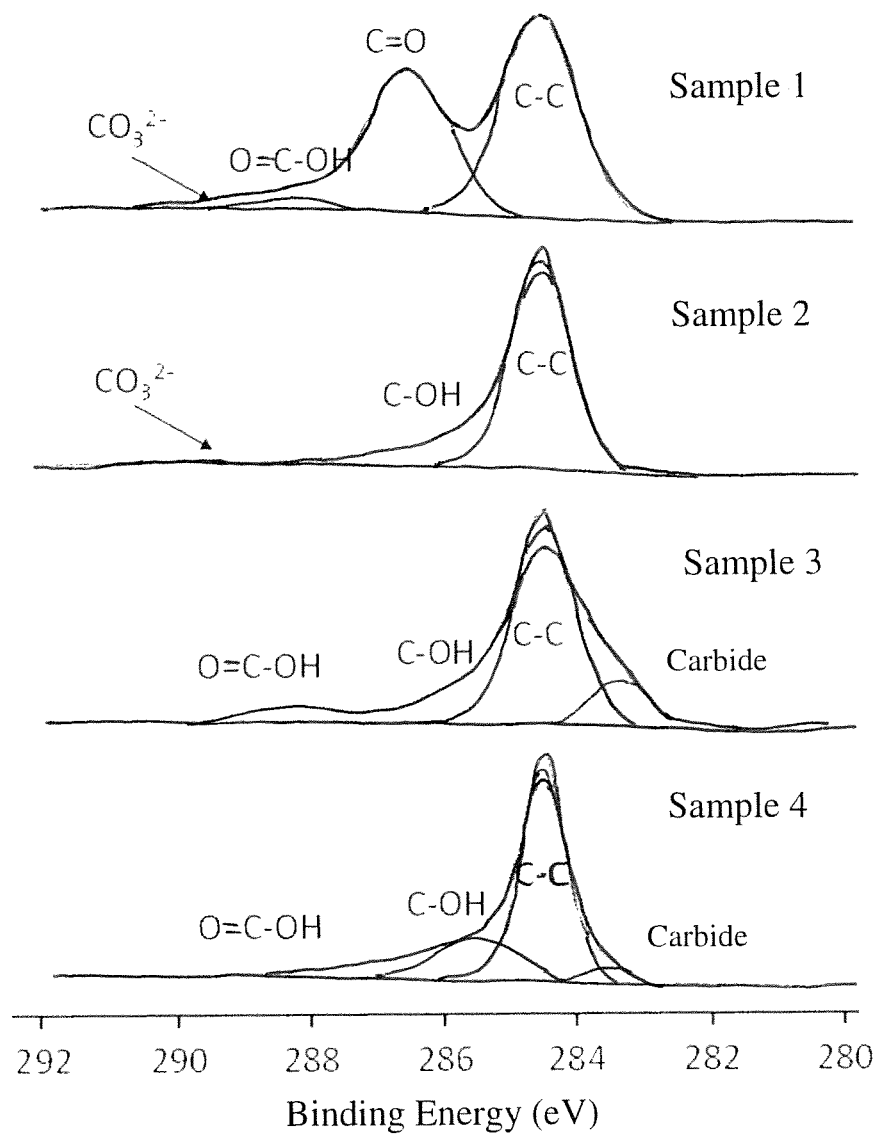
FIG. 2 illustrates x-ray photoelectron spectra of four different types of graphene.

Sample 1 is partially reduced, oxygen intercalated graphene containing ~93% carbon. Samples 2 and 3 are fully reduced multi-layer graphene nanoplatelets with ~99% carbon. The bonding state of the carbon atoms in the different graphene samples were determined using X-ray Photoelectron Spectrometry analysis. As seen from FIG. 2, the absence of the C=O peak in samples 1, 2 and 3 can be attributed to progressive reduction and indicate that the oxygen present is mostly in the form of an intercalating agent (C—O— bonds). That said, in a preferred embodiment the graphene is oxygen intercalated, wherein the oxygen generally forms a single bond with a carbon atom.

In view of the above, the graphene utilized in the present invention generally has a thermal conductivity that ranges in an amount from about 500 to about 2500 W/m-K and preferably from about 700 to about 2200 W/m-K.

In one embodiment to, the graphene utilized is commercially available from Angtron Materials, Dayton Ohio, as N002-PDR GRAPHENE.

In addition to the above, the relative properties of graphene and graphite may also influence the properties of the invention.

Polymer Matrix

The composite compositions of the present invention also include a matrix polymer. A matrix polymer may also be referred to herein as a resin or resin composition. Preferably, the matrix polymer is a curable polymer which is cured by a suitable curing or hardening agent.

Preferably the matrix polymer is epoxy.

Exemplary suitable epoxy resins include, but are not limited to, glycidyl ethers of polyphenols such as bisphenol A, bisphenol F, bisphenol AD, alkylene oxides such as ethylene oxide and propylene oxide, epoxidized biphenyls, epoxidized Nafion, catechol, resorcinol; polyglycidyl ethers prepared by reacting a polyalcohol such as glycerin or polyethylene glycol, and epichlorohydrin; glycidyl ether esters prepared by reacting a hydroxycarboxylic acid such as p-hydroxybenzoic acid or β-hydroxynaphthoic acid, and epichlorohydrin; polyglycidyl esters prepared by reacting a polycarboxylic acid such as phthalic acid or terephthalic acid, and epichlorohydrin; and further epoxidated phenol-novolak resins, epoxidated cresol-novolak resins, epoxidated polyolefins, cycloaliphatic epoxy resins and other urethane-modified epoxy resins, to which, however, the invention should not be limited.

Commercial epoxy resin products are, for example, Epikote resin, MGS LR 1351 which is a bisphenol-A-epichlorhydrin, hexane diol, digylcidylether, available from Momentive (Hexion), Epon™ 828, Epon™ 836 and Epon™ 1001F, Japan Epoxy Resin's Epikote 828, 1001, 801, 806, 807, 152, 604, 630, 871, YX8000, YX8034, YX4000, Cardula E1 OP; Dai-Nippon Ink Industry's Epiclon 830, 835LV, HP4032D, 703, 720, 726, HP820; Asahi Denka Kogyo's EP4100, EP4000, EP4080, EP4085, EP4088, EPU6, EPR4023, EPR1309, EP49-20; and Nagase ChemteX's Denacol EX411, EX314, EX201, EX212, EX252, EX 111, EX146, EX721, to which, however, the invention should not be limited.

Any suitable curing agent in suitable amounts as known to those in the art can be utilized to cure the matrix polymer of the invention, where necessary or desired. For example, in one embodiment a suitable curing agent is EPIKURE Curing Agent MGS RIMH 1366 (Akkyletheramine, isophoronediame, aminoethylpiperazine, 4, 4'-isopropylidenebisphenol).

It has been discovered that high thermal conductivity composite compositions can be prepared comprising both graphite and graphene fillers in a polymer matrix, particularly in epoxy matrix. The graphite and graphene possess exceedingly similar atomic structures and have relatively low thermal resistance at their interfaces. Moreover, the relatively large flake size and planar structure of the graphite ensures a minimization in the number of interfaces per unit length, thereby leading to a relatively high thermal conductivity. The addition of a small amount of graphene further enhances thermal conductivity. Furthermore, when an oxygen intercalated graphene is utilized, the presence of oxygen in the graphene can provide better chemical interaction with the epoxy matrix, which is beneficial for the composite thermal conductivity. In order to achieve desirable high thermal conductivity, specific amounts and ratios of graphite to graphene, in relation to each other, and in the composite compositions, are utilized.

In order to provide desirable high thermal conductivity the total graphite and graphene loading in the composite composition ranges from about 7 to about 40 parts, desirably from about 15 to about 35 parts and preferably is from about 30 to about 35 parts based on 100 total parts by weight of graphite, graphene, and matrix polymer preferably epoxy. As indicated herein, the ratio of graphite to graphene is key to providing desired thermal conductivity. That said, the ratio of graphite to graphene is 4:1 or about 5:1 to about 7:1 and preferably about 6:1 but depends on the relative thermal conductivities, sizes, aspect ratios and surface characteristics of the graphene, graphite and matrix polymer. In one embodiment where the total graphite and graphene loading ranges from about 15 to about 35 or about 40 parts or from about 30 to about 35 parts based on 100 total parts by weight of graphite, graphene and matrix polymer, the ratio of graphite to graphene utilized is greater than 4:1 to about 7:1 and preferably is about 6:1, which can result in thermal conductivities having a greater than theoretical prediction.

The composite compositions may additionally contain other components such as, but not limited to, other fillers, reinforcing agents, release agents, pigments or coloring agents, antifoaming agents, antioxidants, flame retardants, leveling agents, mold release agents, processing aids, lubricants, heat stabilizers, UV stabilizers, impact modifiers, and/or tougheners. Obviously, the additives are utilized in amounts which do not adversely affect the desired properties and processing parameters of the invention.

One method of forming a composite composition of the present invention is as follows. The graphite, graphene and epoxy are mixed, preferably with the graphite and graphene being dispersed within the epoxy matrix and the composition is cured. In some embodiments an intermediate step is performed involving degassing and cooling prior to adding a curing agent or hardener to the composition in order to cure the epoxy resin. In another embodiment, the graphite and graphene as well as any other optional desired components can be dispersed in a medium, such as acetone and stirred such as utilizing a magnetic stirrer for a suitable period of time to achieve desired dispersion prior to combining with the epoxy resin and hardener.

The thermal conductivity of the composite compositions of the present invention can vary and depend upon the types and amounts of the components utilized in the composition. With that said, thermal conductivities of at least 5 W/m-K have been achieved for compositions having 7 total parts by weight graphite and graphene based on 100 parts by weight of graphite, graphene and matrix polymer. Additionally, thermal conductivities of at least 7 W/m-K have been achieved for compositions having 14 total parts by weight graphite and graphene based on 100 parts by weight of graphite, graphene and matrix polymer. Additionally, thermal conductivities of at least 27, at least 30 or at least 40 W/m-K have been achieved for compositions having 35 total parts by weight graphite and graphene based on 100 parts by weight of graphite, graphene and matrix polymer.

The composite compositions of the present invention have immense potential for applications as thermal interfaced materials, heat spreaders, gap fillers and thermal pads, for example, in use in electronic devices to provide good thermal contact between various components of a thermal management package.

For example FIG. 1 illustrates a top view of one embodiment of a composite composition of the present invention utilized in an electronic device. Referring to FIG. 1, an electronic device 10 is illustrated and includes a substrate 12. A heat producing component 14 is operatively connected to the substrate 12. A heat dissipating component 18 is also operatively connected to the substrate. An electrically insulating and thermally conductive composite composition 16 of the present is disposed between the heat producing component 14 and the heat dissipating component 18.

Examples of heat producing components include, but are not limited to, chips or microchips, boards, CPUs, displays, wiring, motors, etc. Heat dissipating components include, but are not limited to, heat sinks, heat fins, metal components or the like.

The high thermal conductivity composition of the present invention is disposed between the heat producing component and the heat dissipating component in one embodiment by filling a gap therebetween which improves thermal conduction between said components. When the composite composition has a sufficiently low electrical conductivity, the composite composition can be considered an electrically isolating layer between the heat producing component and heat dissipating component.

EXAMPLES

The examples set forth below are provided to illustrate the high thermal conductivity composite compositions of the present invention. These examples are not intended to limit the scope of the invention.

Composite samples were prepared for three different levels of total filler loadings consisting of graphite and graphene, namely 35 wt %, 14 wt % and 7 wt % through ultrasonication with magnetic stirring of a dispersion of the fillers in acetone for 4 hours followed by addition of the epoxy resin and hardener with an intermediate step involving degassing and cooling following the addition of the epoxy resin and prior to adding the hardener. Asbury Carbons 3807 surface enhanced flake graphite from Asbury Carbons, N02-PDR GRAPHENE from Angtron Materials, EPIKOTE RESIN MGSLR 135 epoxy from Momentive (Hexion), and EPICURE CURING AGENT MGS RIMH 1366 (H134i/H137i) hardener from Momentive (Hexion) were utilized. The samples were finally press molded, cured overnight at room temperature and post-cured at 90° C. for 6 hours. It should be noted that for each particular total filler concentration (35 wt %, 14 wt % and 7 wt %), the relative amounts of graphite and graphene were varied from 100% graphite to 100% graphene (whenever possible). For the higher overall filler concentrations (35 wt % and 14 wt %), it was not possible to prepare samples with graphene concentrations exceeding ⅕th of the total filler concentration due to the extremely low bulk density (hence a very high volume) of the graphene. For example, in the case of the samples with 35 wt % total filler, preparing a sample with more than 5 wt % graphene was not very feasible from a polymer processing standpoint.

Figure 3:
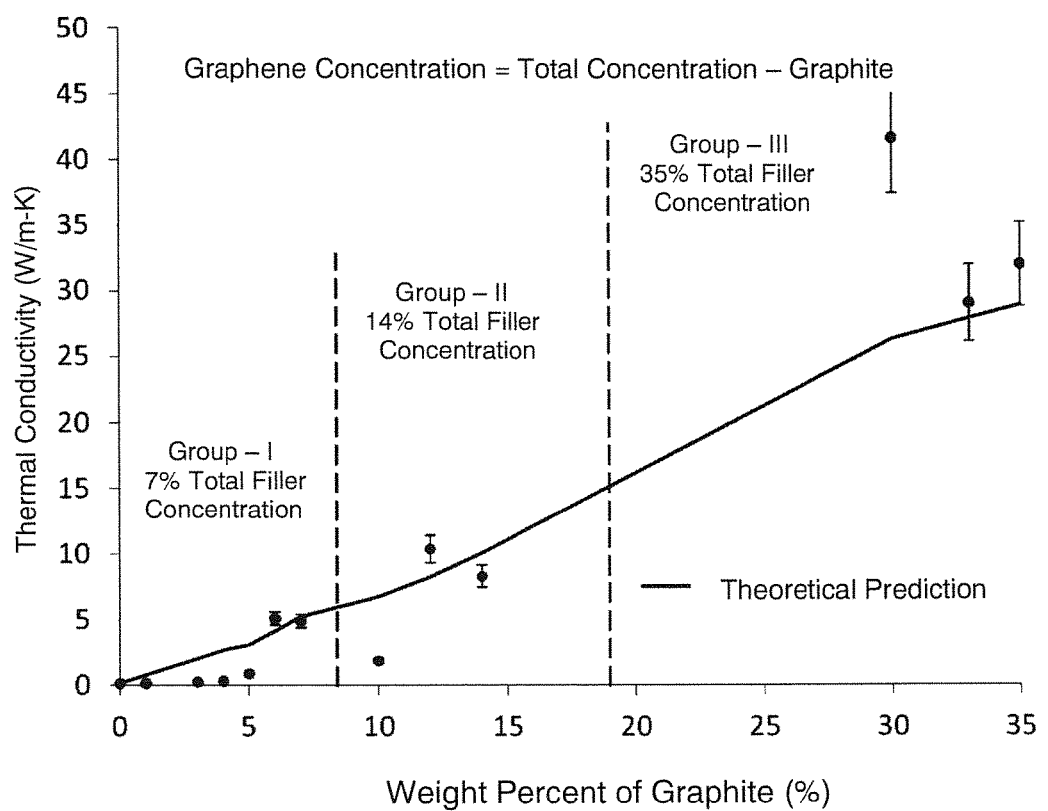
FIG. 3 illustrates a comparison of the theoretical predictions for thermal conductivities with the experimentally measured values.

The measured thermal conductivities are presented in FIG. 3 as a function of the concentration of graphite. The thermal conductivity of 42.4±4.8 W/m-K, nearly 250 times enhancement over the thermal conductivity of 0.17 W/m-K of the pristine epoxy, obtained for the group—III sample with 30 wt % graphite and 5 wt % graphene is significantly higher than the highest thermal conductivity (or the thermal conductivity enhancement) reported for comparable samples in the literature. For example, Gonnet et al. reported a maximum thermal conductivity of ~10 W/m-K for epoxy composites with ~30 vol % aligned single-walled nanotubes. In comparison, the maximum thermal conductivity measured in this work was more than 4 times a comparable literature value and achieved at a significantly lower volume fraction of 17.3%. This extremely high thermal conductivity is primarily due to the large graphite flakes with lateral dimensions ranging up to 500 μm and the corresponding low number of interfaces per unit length. As expected, the thermal conductivity increases with increasing graphite concentration. However, there is significant variation in thermal conductivity among samples with the same total concentration of fillers, which can be explained based on the differences in the relative concentrations and thermal conductivities of the graphite and graphene fillers in those samples. While the graphite flakes used in the examples were measured to have a thermal conductivity of 1442±176 W/m-K, the graphene nanoplatelets only had a thermal conductivity of 776±96 W/m-K. However, there appears to be additional mechanisms influencing the magnitude of the composite thermal conductivity. The following section is devoted to providing an exhaustive analysis of measured thermal conductivities and a deeper understanding of the thermal transport behavior of the micro-nano hybrid composites.

The thermal conductivities predicted using theoretical analysis are compared in FIG. 3 with the experimental measurements for the different groups of samples based on the total concentration of fillers. FIG. 3 first reveals that when no graphene is present in the samples (see the three points at a graphite wt % of 7, 14 and 35), the theoretical analysis does a reasonable job predicting the thermal conductivity of the composite. Second, it is interesting to note that there is a theoretical over-prediction of thermal conductivity of samples in Group—I with a graphene concentration more than 5 wt % (graphite concentration less than 2 wt %). A similar phenomenon is observed for the Group—II samples. Note that Group—III samples comprised of high graphene concentrations could not be formed due to problems associated with structural integrity. This over-prediction indicates that the magnitude of the thermal resistance at graphene-epoxy interfaces must be higher than the value for graphite-epoxy interfaces. Note that the increase in the number of graphene-epoxy interfaces is very well accounted for in the theoretical analysis, and therefore the increase in the number of interfaces per unit length cannot explain the discrepancy. Therefore, the discrepancy between the theoretical predictions and the experimental measurements, particularly at high graphene concentrations, can only be explained by concluding that a higher resistance for graphene-epoxy interfaces must be present as compared to graphite—epoxy interfaces.

FIG. 3 also reveals that at some optimum ratio of graphene-to-graphite concentration, particularly when the amount of graphene is low but not zero, the experimental results surpass the theoretical prediction. This occurs in each of the three groups, but is especially evident for the samples of Group—III. Given that the volume fractions used in the calculations were determined from experimentally measured densities of the samples, the only plausible explanation for such an under-prediction is the overall interface resistance being lower than the value reported in the literature (~10-6 m2-K/W). Considering that in these samples there is a small amount of nanoscale filler along with a microscale filler, such a phenomenon is not entirely unlikely. In fact, previous studies dealing with combinations of carbon nanotubes and graphite nanoplatelets, and single and multi-layer graphene in epoxy matrix also report similar behavior where the thermal conductivity of the composites was seen to abruptly increase for certain relative concentrations of the two fillers. The enhancement in thermal conductivity was attributed to the nanotubes bridging the gaps between the graphite nanoplatelets and a lower resistance at the graphene-epoxy interfaces. A close look at the SEM images of the composites shows that the graphene nanoplatelets are very well embedded in the epoxy matrix and serve to provide better thermal contacts with the larger graphite flakes compared to the case of the neat epoxy. This would mean lower thermal resistance at the graphite-epoxy interfaces and hence higher than expected thermal conductivities. An alternative interpretation is to consider the possibility of graphite-graphene interfaces when the graphite flakes contact the epoxy containing embedded graphene. The graphitegraphene interfaces, constitutive of similar materials, are very likely to have significantly lower resistances, hence leading to higher than expected thermal conductivities.

As described above, while graphene alone in the composite contributes to a high interface resistance, the combination of graphite and a small amount of graphene reduces the overall aggregate interface resistance. A close look at the thermal characterization results reveals that the composite thermal conductivity shows an abrupt increment at a relative graphite-to-graphene concentration ratio of 6:1 for all three groups of samples. The fact that the exact same ratio leads to a significant improvement in thermal conductivity at three different overall filler concentrations makes it more than a mere coincidence. The ratio also depends on the relative thermal conductivities of the two fillers, their aspect ratios and the relative magnitudes of the interface thermal resistance.

In accordance with the patent statutes, the best mode and preferred embodiment have been set forth; the scope of the invention is not limited thereto, but rather by the scope of the attached claims.

What is claimed is:

1. A composite composition, comprising:
an epoxy matrix, micro-size graphite, wherein the micro-size graphite has a particle size that ranges from about 5 to about 500 microns in width, 5 to about 500 microns in length, and 5 to about 500 nanometers in height, and nano-sized graphene sheets having a nanometer scale thickness, wherein the weight ratio of graphite to graphene is from about 4:1 to about 7:1, and wherein the total amount of graphite and graphene is about 7 parts to about 35 parts per 100 total parts by weight of epoxy matrix, graphite and graphene, and wherein the composition has a thermal conductivity of at least 5 W/m-K.

2. The composition according to claim 1, wherein the graphene is oxygen intercalated.

3. The composition according to claim 2, wherein the total amount of graphite and graphene is about 15 to about 35 parts per 100 total parts by weight of epoxy matrix, graphite and graphene.

4. The composition according to claim 3, wherein the weight ratio of graphite to graphene is from about 5:1 to about 7:1.

5. The composition according to claim 4, wherein the total amount of graphite and graphene is about 30 to about 35 parts per 100 total parts by weight of epoxy matrix, graphite and graphene.

6. The composition according to claim 2, wherein the carbon content of the graphene is greater than 90 weight percent of the graphene, and wherein the graphene has a thermal conductivity of about 500 to about 2500 W/m-K.

7. The composition according to claim 1, wherein the composition has at least 14 to about 35 total parts by weight graphite and graphene based on 100 parts by weight of graphite, graphene and epoxy matrix.

8. The composition according to claim 1, wherein the composition has a thermal conductivity of at least 7 W/m-K and the composition has at least 14 to about 35 total parts by weight graphite and graphene based on 100 parts by weight of graphite, graphene and epoxy matrix.

9. The composition according to claim 1, wherein the composition has a thermal conductivity of at least 27 W/m-K and the composition has about 35 total parts by weight graphite and graphene based on 100 parts by weight of graphite, graphene and epoxy matrix.

10. An electronic device, comprising:
a substrate, a heat producing component operatively connected to the substrate, a heat dissipating component operatively connected to the substrate, and an electrically insulating and thermally conductive composite composition disposed between and thermally connecting the heat producing component and the heat dissipating component, the composite composition comprising an epoxy matrix, micro-size graphite, wherein the micro-size graphite has a particle size that ranges from about 5 to about 500 microns in width, 5 to about 500 microns in length, and 5 to about 500 nanometers in height, and nano-sized graphene sheets, having a nanometer scale thickness, wherein the weight ratio of graphite to graphene is from about 4:1 to about 7:1, and wherein the total amount of graphite and graphene is about 7 parts to about 35 parts per 100 total parts by weight of epoxy matrix, graphite and graphene, and wherein the composition has a thermal conductivity of at least 5 W/m-K.

11. The device according to claim 10, wherein the graphene is oxygen intercalated.

12. The device according to claim 11, wherein the total amount of graphite and graphene is about 15 to about 35 parts per 100 total parts by weight of epoxy matrix, graphite and graphene.

13. The device according to claim 12, wherein the weight ratio of graphite to graphene is from about 5:1 to about 7:1.

14. The composition according to claim 13, wherein the total amount of graphite and graphene is about 30 to about 35 parts per 100 total parts by weight of epoxy matrix, graphite and graphene.

15. The composition according to claim 14, wherein the carbon content of the graphene is greater than 90 weight percent of the graphene, and wherein the graphene has a thermal conductivity of about 500 to about 2500 W/m-K.

16. The composition according to claim 10, wherein the composition has at least 14 to about 35 total parts by weight graphite and graphene based on 100 parts by weight of graphite, graphene and epoxy matrix.

17. The composition according to claim 10, wherein the composition has a thermal conductivity of at least 7 W/m-K and the composition has at least 14 to about 35 total parts by weight graphite and graphene based on 100 parts by weight of graphite, graphene and epoxy matrix.

18. The composition according to claim 10, wherein the composition has a thermal conductivity of at least 27 W/m-K and the composition has about 35 total parts by weight graphite and graphene based on 100 parts by weight of graphite, graphene and epoxy matrix.

* * * * *